United States Patent [19]

Hinoda et al.

[11] Patent Number: 4,547,074
[45] Date of Patent: Oct. 15, 1985

[54] COLOR SENSING DEVICE

[75] Inventors: Seisuke Hinoda, Uji; Masao Hirano, Takatsuki; Mitsutaka Kato; Hirohiko Yasuda, both of Kyoto, all of Japan

[73] Assignee: Omron Tateisi Electronics Co., Kyoto, Japan

[21] Appl. No.: 376,138

[22] Filed: May 7, 1982

[30] Foreign Application Priority Data

May 8, 1981 [JP] Japan .................................. 56-69838

[51] Int. Cl.$^4$ ............................................... G01J 3/50
[52] U.S. Cl. .................................. 356/405; 250/211 J; 250/226; 356/416; 357/32
[58] Field of Search ............... 356/402, 405, 406, 407, 356/414, 416, 419; 250/226, 211 J; 357/30, 32

[56] References Cited

U.S. PATENT DOCUMENTS 3,389,265 6/1968 Schreckendgust .
3,929,398 12/1975 Bates .
3,985,449 10/1976 Patrin .

FOREIGN PATENT DOCUMENTS 2424545 1/1975 Fed. Rep. of Germany .
2546253 4/1977 Fed. Rep. of Germany ...... 356/416
154348 12/1979 Japan .................................. 356/416

OTHER PUBLICATIONS

Kato et al., *Journal of Physics E*, vol. 9, No. 12, Dec. 1976, pp. 1070-1072.

*Primary Examiner*—F. L. Evans
*Attorney, Agent, or Firm*—Cushman, Darby & Cushman

[57] ABSTRACT

A color sensing device comprising four photo-electric transducers formed on a semiconductor substrate, an interference filter provided on the light receiving face of each transducer, a colored filter for selecting a specified transmission band of the interference filter, and three electrodes for delivering electric signals from the transducers individually, one of the electrodes being provided for two of the transducers in common. The transducers each have the area of its light receiving face so determined as to exhibit spectral sensitivity characteristics matching the color matching function of the CIE (Commission Internationale de l'Eclairage) XYZ colorimetric system.

10 Claims, 12 Drawing Figures

COLOR SENSING DEVICE

BACKGROUND OF THE INVENTION

The present invention relates to a device for sensing the color of light emitted by a light source or the color of an article, i.e. the color of the light reflected from or transmitted through the article.

For sensing or discriminating colors, photoelectric colorimeters are widely used which comprise a plurality of photoelectric detectors, e.g. photocells, a filter arranged in front of each of the detectors and having the desired spectral transmission characteristics, and an electric circuit for processing the output signal from the detector. The spectral sensitivity curve afforded by the spectral sensitivity of the photoelectric detector itself combined with the spectral transmission characteristics of the filter must be in agreement with the color matching function of the XYZ colorimetric system. However, it is extremely difficult to fulfill this requirement by existing filters in whatever combination, chiefly because the $\bar{x}$ value of the spectral tristimulus values, namely $\bar{x}$, $\bar{y}$ and $\bar{z}$, has two peaks and because the spectral sensitivity of the photoelectric detector itself varies greatly with the wavelength of light. Further since the conventional photoelectric colorimeter has at least three sets of independent photoelectric detectors and filters, the light is invariably incident on a large area. This means that the device is susceptible to the influence of unevenness of light intensity. If the intensity of the light incident on the detectors differs from location to location, the device is unable to sense colors accurately.

SUMMARY OF THE INVENTION

An object of the present invention is to provide a device for sensing or discriminating colors with high accuracy.

Another object of the invention is to provide a compacted color sensing device.

The color sensing device of this invention comprises four photoelectric transducers formed on a semiconductor substrate, an interference filter provided on the light receiving face of each of the transducers, means for selecting a specified transmission band of the filter, and three electrodes for delivering electric signals from the transducers individually, one of the electrodes being provided for two of the transducers in common. The area of the light receiving face of each photoelectric transducer is determined and the interference filter is combined with the selecting means so that the spectral sensitivity of the device matches the color matching function of the CIE (Commission Internationale de l'Eclairage) XYZ colorimetric system. The XYZ colorimetric system herein referred to includes an XYZ colorimetric system for observation at a visual angle of 1° to 4° and an $X_{10}Y_{10}Z_{10}$ colorimetric system (supplementary colorimetric system) for observation at a visual angle of 10°. Useful selecting means include absorbing filters and interference filters.

Since all the photoelectric transducers are formed monolithically on a semiconductor substrate according to the invention, the color sensing device is compact, has a reduced area of incidence of light and therefore senses color with high accuracy almost without being influenced by the unevenness of light intensity at different locations. When each of the transducers is adapted to have a large number of light receiving faces which are in a scattered arrangement over the semiconductor substrate, the error due to the unevenness of intensities of incident light can be minimized. While the interference filter has a plurality of transmission bands, the desired one of them is selected by the selecting means according to the invention. The maximum sensitivity in the selected transmission band is determined by the area of the light receiving face of the transducer. The desired spectral sensitivity can therefore be obtained as matched with the color matching function of the XYZ colorimetric system. Moreover, since the output terminals of two photoelectric transducers are connected to each other, the stimulus value $\bar{x}$ having two peaks can be represented by the output signal.

The present invention will become more apparent from the following description of embodiments given with reference to the accompanying drawings.

DESCRIPTION OF THE PREFERRED EMBODIMENTS

Figure 1:
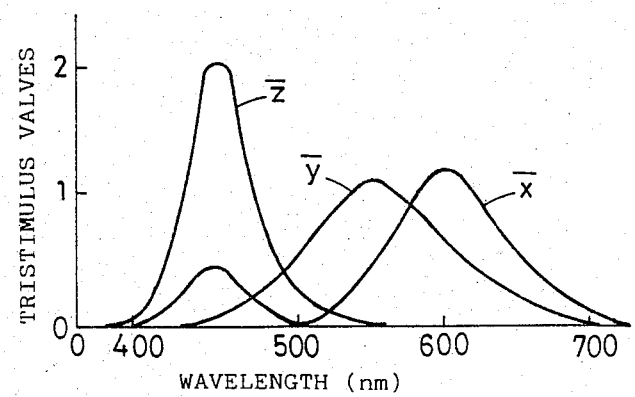
FIG. 1 is a graph showing the color matching function of the XYZ colorimetric system.

FIG. 1 shows the color matching function of the CIE XYZ colorimetric system. The value $\bar{x}$ of the tristimulus values has two peaks at wavelengths of 600 nm and 440 nm, and $\bar{y}$ and $\bar{z}$ have peaks at 555 nm and 445 nm, respectively. The present invention provides a color sensing device having spectral sensitivity characteristics identical with the color matching function in the form of these curves.

Figure 2:
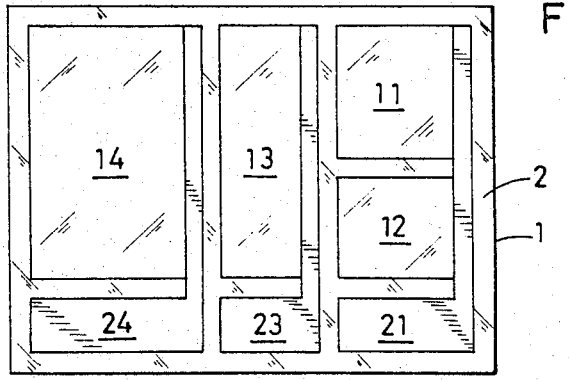
FIG. 2 is a plan view showing an embodiment of the invention with interference filters and colored filters removed therefrom.
Figure 3:
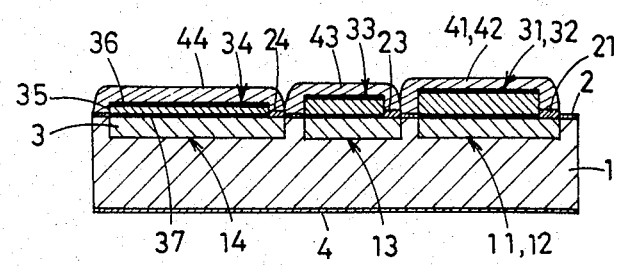
FIG. 3 is a sectional view showing the embodiment of FIG. 2.

FIGS. 2 and 3 show the construction of the device. A thermally grown thin layer 2 of silicon dioxide is formed on an n-type silicon substrate 1, and four portions of the layer 2 are removed by etching to form windows. The substrate 1 is doped with p-type impurities, e.g. boron, by thermal diffusion through the windows to form p-type regions 3. The four p-n junction photodiodes 11, 12, 13 and 14 are formed on the silicon substrate 1. The light receiving faces of the photodiodes 11 to 14 are approximately in the ratio of 1.0:0.8:1.3:2.5 in area. Three bonding pads 21, 23 and 24 serving as positive electrodes are formed on the upper surface of the silicon substrate 1, while a common negative electrode 4 is provided over the entire bottom surface of the substrate 1. These electrodes are formed from aluminum or gold by vacuum evaporation or sputtering. The electrode 21, which is provided for the photodiodes 11 and 12 in common, is in ohmic contact with the p-type regions 3 thereof. The electrodes 23 and 24 are connected to the p-type regions of the photodiodes 13 and 14, respectively.

Interference filters 31, 32, 33 and 34 are provided over the light receiving faces of the photodiodes 11, 12, 13 and 14, respectively. Each of the interference filters comprises a transparent dielectric layer 35, and light-transmitting metal films 36 and 37 sandwiching the layer 35 therebetween from above and below. Examples of useful dielectric materials are magnesium fluoride ($MgF_2$), zinc sulfide (ZnS), etc. Silver or aluminum is used for the metal films. The layer and films are formed by vacuum evaporation. The interference filters 31 to 34 differ in the thickness of the dielectric layer 35. The thickness is controlled by lift-off or like known technique. Sharp cutoff high-pass colored filters 41 to 44 are further formed over the interference filters 31 to 34, respectively. The filters 41 to 44 differ in cutoff wavelength. The colored filter can be produced, for example, by screenprinting a gelatin film colored with an organic pigment, by exposing a photosensitive film to light of the desired color, or by transfer technique.

The interference filter has a plurality of transmission bands. The important characteristics of the transmission band are the center wavelength (peak wavelength) $\lambda_m$, half-width W and peak transmission $\tau$, which are given approximately by the following equations:

$$\lambda_m m = 2 t \cdot \cos \phi \quad (1)$$

$$W = \frac{1 - R}{\pi m \sqrt{R}} \cdot \lambda_m \quad (2)$$

$$\tau = \left(1 - \frac{A}{1 - R}\right)^2 \quad (3)$$

where m is the order of the transmission band and is given by a positive integer, t is the optical thickness of the dielectric layer involving the effect of phase change on internal reflection, $\phi$ is the angle between the light which undergoes repeated internal reflection within the dielectric layer and a line normal to the surface of the dielectric layer, R is the reflectivity of the metal film, and A is the fraction of light absorbed by the metal film. Equation (1) shows that the peak wavelength $\lambda_m$ is dependent on the thickness of the dielectric layer 35. The half-width W is dependent on the peak wavelength $\lambda_m$ and on the reflectivity R of the metal films 36 and 37; the higher the reflectivity, the smaller is the half-width. The reflectivity of the metal films is dependent on the thickness thereof.

Figure 4:
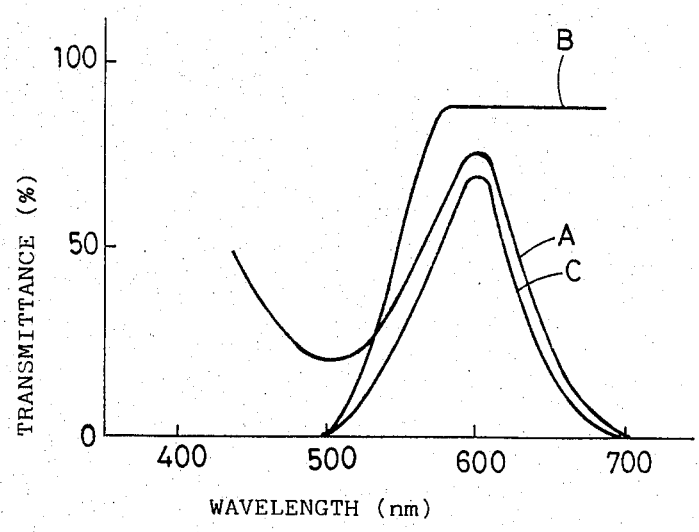
FIG. 4 is a graph showing how the desired one of the transmission bands of an interference filter is selected by a colored filter.

FIG. 4 shows how one of the plurality of transmission bands of the interference filter is selected by the colored filter. Curve A, showing the spectral transmittance of the interference filter 31, has a peak at a wavelength of 600 nm (in the band with m=1) and is continuous with another peak at shorter wavelengths. Curve B shows the spectral transmittance of the colored filter 41. The filter 41 has the characteristics to pass only the light of wavelengths in the primary (m=1) transmission band of the interference filter 31 and of longer wavelengths but block light of shorter wavelengths. Indicated at C is the spectral transmittance curve afforded by the combination of the interference filter 31 and the colored filter 41. It will be understood that the desired one of the plurality of transmission bands of the interference filter 31 is selected by the colored filter 41. Similarly the colored filters 42 to 44 each select the desired one transmission band only for the interference filters 32 to 34.

Figure 5:
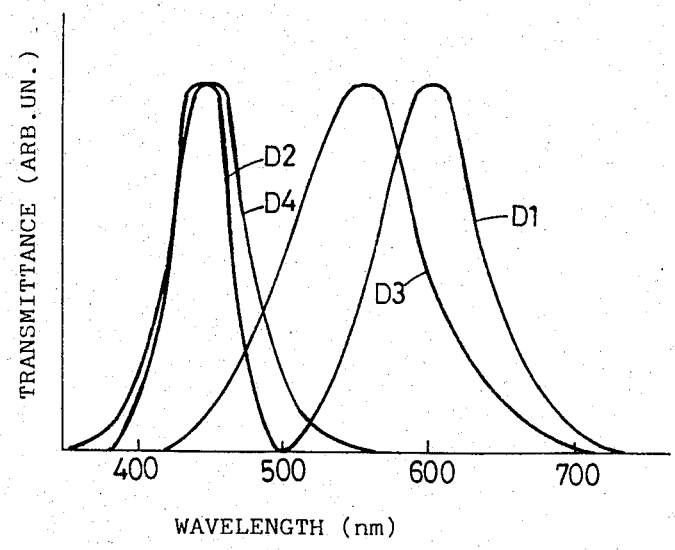
FIG. 5 is a graph showing the selected transmission bands of the interference filters.

FIG. 5 shows the relative spectral transmittance curves D1 to D4 of the transmission bands thus selected for the interference filters 31 to 34. For convenience sake, it is herein assumed that the peak transmissions of all the bands are equal. The peak wavelengths and half-widths of these transmission bands are given by Equations (1) and (2). By controlling the thicknesses of the dielectric layers and the thicknesses of the metal films for the interference filters 31 to 34, the peak wavelengths and half-widths of the band curves D1 to D4 are determined as follows.

| Transmission band | Peak wavelength (nm) | Half-width (nm) |
| --- | --- | --- |
| D1 | 600 | 80 |
| D2 | 440 | 50 |
| D3 | 555 | 100 |
| D4 | 445 | 55 |

Vacuum-evaporated aluminum films have higher adhesion to the substrate and undergo lesser variations in reflectivity with the lapse of time than silver films. The reflectivity of aluminum films increases at shorter wavelengths. The half-width of the transmission band of the interference filter decreases with an increase in the reflectivity of the metal film. As listed in the above table, the transmission bands D2 and D4 at shorter wavelengths are smaller in half-width than the bands D1 and D3 at longer wavelengths. This tendency is almost in agreement with the spectral reflectivity characteristics of aluminum films. Thus it is more advantageous to use aluminum films than silver films.

Figure 6:
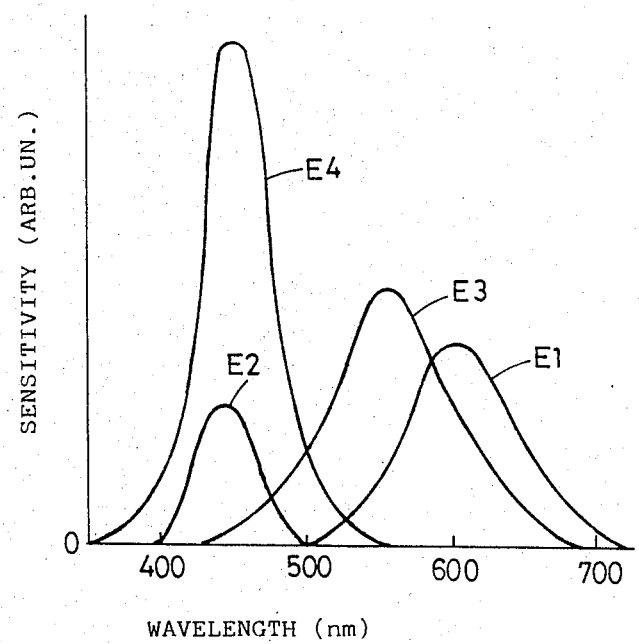
FIG. 6 is a graph showing spectral sensitivity curves each obtained from the combination of a photodiode, interference filter and colored filter when it is assumed that the spectral sensitivities of the photodiodes per se are constant.

Since the photodiodes 11 to 14 differ in the area of the light receiving face as stated above, the amount of incident light detected by the photodiodes 11 to 14 differs from diode to diode. FIG. 6 shows the transmittances D1 to D4 of FIG. 5 multiplied by the areas of the light receiving faces of the photodiodes 11 to 14, respectively, i.e. relative spectral sensitivity curves E1 to E4. It is herein assumed that the sensitivities of the photodiodes are constant on the wavelength axis.

Figure 7:
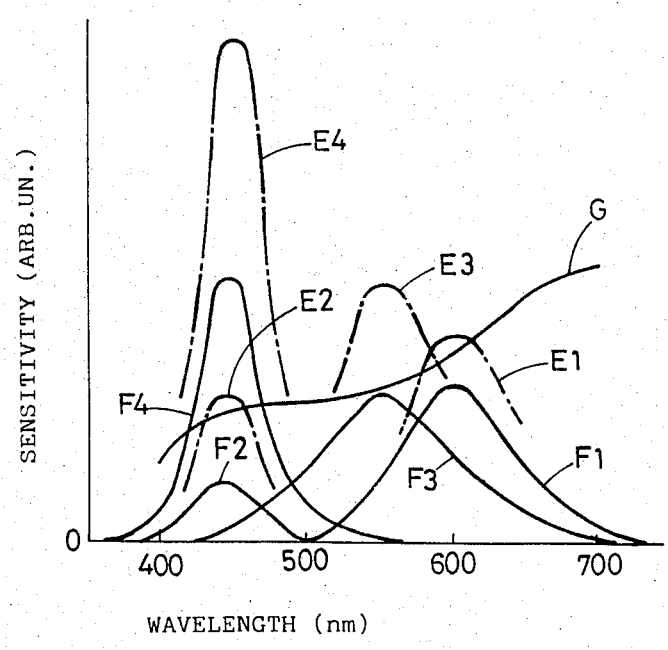
FIG. 7 is a graph showing how combined spectral sensitivities are obtained in a match with the color matching function.

However, the spectral sensitivities of photodiodes are not constant generally. As represented by curve G in FIG. 7, the sensitivity decreases with decreasing wavelength. FIG. 7 shows curves F1 to F4 which represent curves E1 to E4 each multiplied by the spectral sensitivity G of the photodiode. The spectral sensitivities F1 to F4 thus obtained are true combined spectral sensitivities in proportion to the color matching function shown in FIG. 1.

It will be understood that the peak sensitivities of the spectral sensitivities F1 to F4 are determined by the areas of the light receiving faces of the photodiodes 11 to 14. In the foregoing description, the peak values of the transmittances D1 to D4 (FIG. 5) afforded by the interference filters and the colored filters in combination are all assumed to be equal. However, Equation 3 indicates that the peak transmission of the interference filter is dependent on the reflectivity and the fraction of light absorbed by the metal film. In order to obtain the desired half-width values, the interference filters 31 to 34 differ from one another in the reflectivity of the metal films 36 and 37 and therefore in the peak transmission thereof. It is desirable to determine the areas of the light receiving faces of the photodiodes 31 to 34 also in view of the differences in the peak transmission. When light is projected on an article for the discrimination of its color, the areas of the light receiving faces of the photodiodes 31 to 34 will be determined also in view of the spectral intensity of the light source.

The output signal of the photodiode is given by the open-circuit voltage obtained when the circuit of its anode and cathode is opened, or by the short-circuit current obtained when the circuit is shorted. The short-circuit current is in proportion to the amount of incident light. It is now assumed that the sum of the short circuit currents of the photodiodes 31 and 32 from the electrode 21 is Ix, and the short circuit currents of the photodiodes 33 and 34 from the electrodes 23 and 24 are Iy and Iz, respectively. The chromaticity coordinates x and y are given by the following equations.

$$x = \frac{Ix}{Ix + Iy + Iz} \quad (4)$$

$$y = \frac{Iy}{Ix + Iy + Iz} \quad (5)$$

These coordinates x and y represent the nature of color other than lightness. The data relating to lightness is obtained from one or the sum of the short circuit currents Ix, Iy and Iz, or from the output of another photoelectric transducer provided separately. The circuit for calculating the chromaticity coordinates and the circuit for giving a color sensing signal output based on the result of calculation can be provided integrally on the semiconductor substrate 1.

Figure 8:
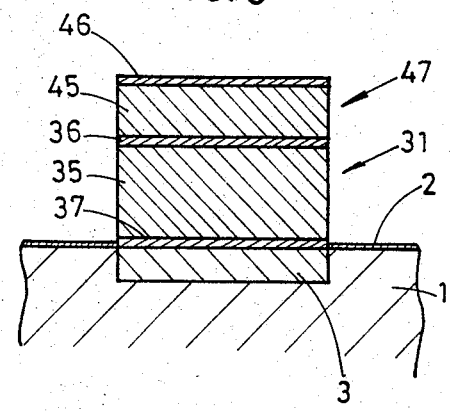
FIG. 8 is a fragmentary enlarged view in section showing a modification wherein an interference filter is used as selecting means.

FIG. 8 shows a modification of the means for selecting the desired transmission band of the interference filter. Another interference filter 47 is formed by vacuum evaporation over the interference filter 31. The filter 47 comprises a dielectric layer 45, and metal films 46 and 36 sandwiching the layer 45 from above and below. One of the transmission bands of the interference filter 47 matches the transmission band of the filter 31 having a peak wavelength at 600 nm (although different in the order of band).

Figure 9:
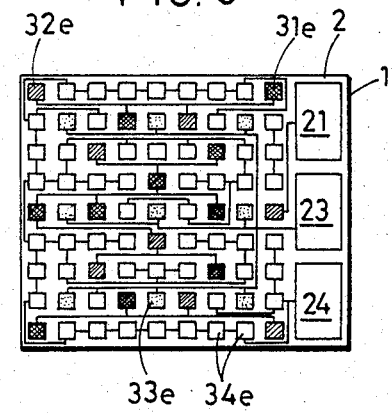
FIG. 9 is a plan view showing another embodiment wherein each of the photoelectric transducers comprises a multiplicity of photodiodes in a scattered arrangement.
Figure 10:
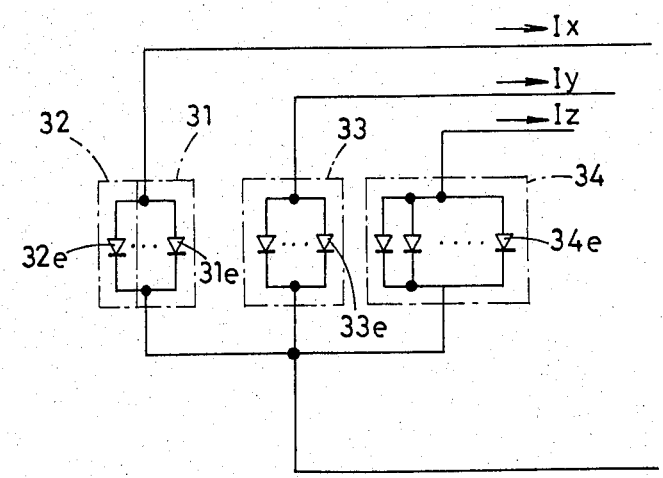
FIG. 10 is an electric circuit diagram showing the connection of the photodiodes of the embodiment of FIG. 9.

FIGS. 9 and 10 show another embodiment, which comprises a large number of small p-n junction photodiodes arranged regularly in vertical and horizontal rows. The photodiodes 31e constituting a phototransducer 31 and the photodiodes 32e constituting a phototransducer 32 are in a scattered arrangement on a substrate 1 and are connected in parallel with an electrode 21 by an electroconductive pattern formed on the substrate 1. The peak value of spectral sensitivity F1 is determined by the sum of the areas of the light receiving faces of the photodiodes 31e, and the peak value of spectral sensitivity F2 by the corresponding sum of the photodiodes 32e. Similarly phototransducers 33 and 34 comprrise photodiodes 33e and 34e, respectively, in a dispersed arrangement. When each phototransducer is thus composed of small photodiodes in a scattered arrangement, the measuring error that would result if the intensity of incident light varies from location to location can be minimized.

Figure 11:
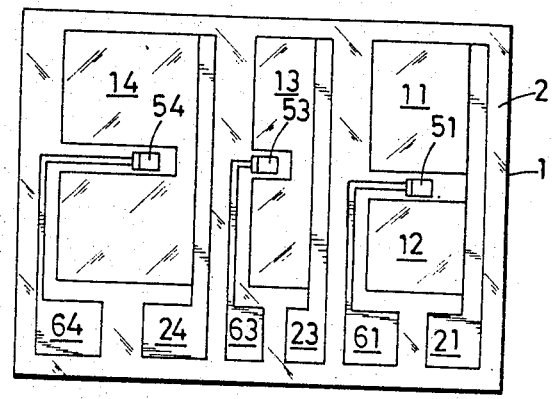
FIG. 11 is a plan view showing another embodiment including photoelectric transducers for measuring the intensity of incident light.
Figure 12:
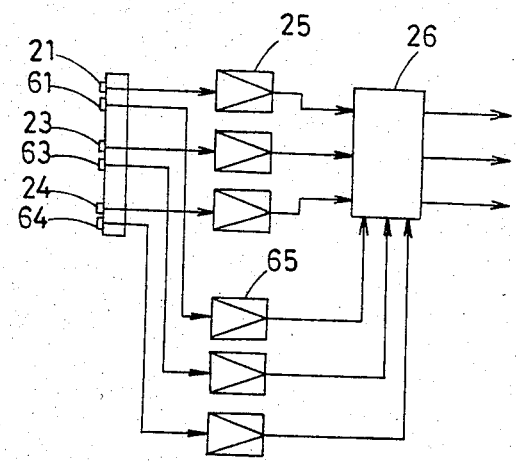
FIG. 12 is a diagram showing the electric circuit of the embodiment of FIG. 11.

FIGS. 11 and 12 show still another embodiment, which comprises photodiodes 11 and 12, 13, and 14 on a substrate 1 and photodiodes 51, 53 and 54 formed on the substrate 1 and positioned in the vicinity of the photodiodes 11 and 12, 13, and 14, respectively, for measuring the intensity of incident light. The diodes 51, 53 and 54 are connected to electrodes 61, 63 and 64, respectively, and are not provided with any interference or colored filter. The output signals from the photodiodes are fed to a compensation circuit 26 by way of amplifiers 25 or 65. Based on the output signals by the photodiodes 51, 53 and 54, the compensation circuit 26 detects whether or not the intensity of incident light differs at different positions and also detects the degree of the unevenness, if any. Based on the result, the circuit 26 corrects the output signals from the photodiodes 11 and 12, 13, and 14.

What is claimed is:

1. A color sensing device comprising:
   a semiconductor substrate,
   a plurality of photoelectric transducers formed on said substrate, and
   filter means provided on the light receiving face of each of said transducers,
   wherein said filter means has a spectral transmittance substantially corresponding to the normalized wavelength distribution of each value of the tristimulus values $\bar{x}$, $\bar{y}$ and $\bar{z}$, and
   wherein each area of the light receiving faces of said transducers is so determined as to substantially correspond to each peak value of the tristimulus values $\bar{x}$, $\bar{y}$ and $\bar{z}$.

2. A color sensing device as claimed in claim 1, wherein the spectral sensitivity of each of the photoelectric transducers is considered in determining the areas of the light receiving faces of the photoelectric transducers.

3. A color sensing device as claimed in claim 2, wherein the transmittances of the filter means are also considered in determining the areas of the light receiving faces of the photoelectric transducers.

4. A color sensing device as claimed in claim 1, further comprising electric means for adjusting the output from the photoelectric transducers when light receiving areas of the transducers are not properly fabricated.

5. A color sensing device as claimed in claim 1, wherein said tristimulus value $\bar{x}$ ranges from 5000 to 7000 Angstroms with a peak value at 6000 Angstromus.

6. A color sensing device as defined in claim 1, wherein other photoelectric transducers are formed on said substrate for measuring the intensity of incident light, each of which is positioned in the vicinity of each of said transducers on which said filter means are provided.

7. A color sensing device comprising:
   a semiconductor substrate,
   a plurality of photoelectric transducers formed on said substrate, and filter means provided on the light receiving face of each of said transducers, wherein said filter means has a spectral transmittance substantially corresponding to the normalized wavelength distribution of each value of the tristimulus values $\bar{x}$, $\bar{y}$ and $\bar{z}$ wherein each area of the light receiving faces of said transducers is so determined as to substantially correspond to each peak value of the tristimulus values $\bar{x}$, $\bar{y}$ and $\bar{z}$, and wherein each of said transducers on which said filter means are provided has a plurality of light receiving faces in a scattered arrangement on said substrate.

8. A color sensing device comprising:
a semiconductor substrate,
four photoelectric transducers formed on said substrate,
four filter means each of which is provided on the light receiving face of each of said transducers, and
three electrodes formed on the substrate for delivering electric signals from the transducers individually, one of the electrodes being provided for two of said transducers in common, wherein each of said filter means has a spectral transmittance substantially corresponding to the normalized wavelength distribution of each value of the tristimulus values $\bar{x}$, $\bar{y}$ and $\bar{z}$, and wherein each area of the light receiving faces of said transducers is so determined as to substantially correspond to each peak value of the tristimulus values $\bar{x}$, $\bar{y}$ and $\bar{z}$.

9. A color sensing device as defined in claim 8, wherein at least three other photoelectric transducers are formed on said structure for measuring the intensity of incident light, each of which is positioned in the vicinity of each of said transducers on which said filter means are provided.

10. A color sensing device as defined in claim 8, wherein each of said transducers on which said filter means are provided has a plurality of light receiving faces in a scattered arrangement on said substrate.

* * * * *